United States Patent [19]

Cooper

[11] Patent Number: 5,650,257
[45] Date of Patent: Jul. 22, 1997

[54] RADIATION SENSITIVE DEVICES

[75] Inventor: Graham Philip Cooper, Bramley, England

[73] Assignee: Vickers PLC, England

[21] Appl. No.: 262,239

[22] Filed: Oct. 21, 1988

Related U.S. Application Data

[63] Continuation of Ser. No. 94,674, Sep. 11, 1987, abandoned.

[30] Foreign Application Priority Data

Dec. 5, 1985 [GB] United Kingdom ............... 8529958

[51] Int. Cl.$^6$ ............................................. G03F 7/095
[52] U.S. Cl. ................ 430/156; 430/166; 430/167; 430/195; 430/275.1; 430/278.1; 430/281.1
[58] Field of Search .................. 430/270.1, 278, 430/280, 281, 327, 156, 193, 195, 197, 167, 275.1, 281.1

[56] References Cited

U.S. PATENT DOCUMENTS

| | | | |
|---|---|---|---|
| 3,629,036 | 12/1971 | Isaacson | 430/327 |
| 3,647,446 | 3/1972 | Alsup et al. | 430/920 |
| 3,923,761 | 12/1975 | Parker et al. | 430/195 |
| 4,548,884 | 10/1985 | Heiart | 430/22 |
| 4,612,270 | 9/1986 | Pampalone et al. | 430/273 |
| 4,842,982 | 6/1989 | Seibel et al. | 430/156 |

FOREIGN PATENT DOCUMENTS 2124399  2/1984  United Kingdom ........... 430/193

*Primary Examiner*—John S. Chu
*Attorney, Agent, or Firm*—Laff, Whitesel, Conte & Saret, Ltd.

[57] ABSTRACT

A radiation sensitive device comprising a substrate carrying a radiation sensitive layer is coated with a discontinuous covering layer which is more light sensitive than the radiation sensitive layer. The covering layer is formed by spraying and assists in improving vacuum drawdown during image-wise exposure of the device without having a deleterious affect on the exposure and development characteristics of the device.

10 Claims, No Drawings

RADIATION SENSITIVE DEVICES

This application is continuation of application Ser. No. 07/094,674, filed Sep. 11, 1987, abandoned.

This invention relates to radiation sensitive devices and more particularly, but not exclusively, is concerned with radiation sensitive plates for the production of lithographic printing plates.

Such radiation sensitive devices are known and comprise a substrate, e.g. a metallic sheet, coated with a radiation sensitive layer. In use of such devices in lithographic printing plate production, the radiation sensitive layer is exposed to radiation using a transparency so that parts of the layer are struck by the radiation and other parts are not. In the case of negative-working radiation sensitive layers, the radiation struck areas become less soluble than the non-radiation struck areas. In the case of positive-working radiation sensitive layers, the radiation struck areas become more soluble than the non-radiation struck areas. Thus, by treating the image-wise exposed layer with a developer liquid for the more soluble areas, these areas can be selectively removed from the substrate to form an image constituted by the less soluble areas. This image constitutes the printing image of the eventual printing plate and the non-printing areas of the plate are constituted by the surface of the substrate revealed on development.

The printing image and the non-printing areas are essentially co-planar and the lithographic printing process depends upon the differing affinities of the printing image and the non-printing areas for ink and water. The printing image is ink-receptive and water-repellant and the non-printing areas are water-receptive and ink-repellant. During printing, water is applied to the plate and is received by the non-printing areas and repelled by the printing image. Then, ink is applied and this is repelled by the wet non-printing areas and received by the printing image. The ink is then transferred from the printing image onto the paper or the like to be printed.

When image-wise exposing a radiation-sensitive plate in the production of a lithographic printing plate it is essential that there is good contact between the transparency through which the plate is to be exposed and the radiation sensitive layer of the plate itself. The contact is achieved by using a printing down frame in which the plate and transparency are positioned between a flexible backing member and a glass sheet. The air between the backing member and the glass sheet is evacuated causing the plate and transparency to be squeezed together. This process is conventionally referred to as vacuum drawdown.

However, it is possible for pockets of air to be trapped between the smooth surface of the radiation sensitive layer of the plate and the transparency preventing, or at least extending the time required to achieve, the necessary contact. To overcome this problem, the radiation sensitive layer may be given a roughened surface which provides channels through which such air pockets can be evacuated.

There have been many suggestions as to how the roughened surface may be provided and in this regard reference may be made to UK Patent Specifications No. 1495361, No.1512080, No.2046461, and No.2075702 and European Patent Specification No.21428.

Japanese Patent Specification No.98505/76 discloses spraying a waxy or fine-powdered resin from a solvent liquid onto the surface of the radiation sensitive layer so as to leave sprayed particles on the surface.

UK Patent Specification No.2043285 discloses spraying the radiation sensitive layer with a powder and UK Patent Specification No.2081919 discloses spraying the radiation sensitive layer with a water-soluble resin from an aqueous solution.

Whilst these suggestions all improve the vacuum drawdown they have certain disadvantages such as lack of adhesion of the sprayed particles to the radiation sensitive layer or incompatibility of the sprayed material with the radiation sensitive layer, or with the alkaline developer liquids commonly used to develop the radiation sensitive layer after image-wise exposure.

To overcome these disadvantages, European Patent Specification No. 174588 discloses providing the surface of the radiation sensitive layer with a covering layer having the same composition as the radiation sensitive layer by spraying the radiation sensitive layer with a solution containing the same components as the radiation sensitive layer. Whilst this approach gives an improvement it still has certain disadvantages.

In order to function as a drawdown improvement layer, the sprayed particles must stand at least 1 micron proud of the coating surface. In practice, to achieve the optimum effect, the particles should be up to 5 microns above the surface. This means that in the region of the sprayed particles, the total thickness of the coating on the substrate is always at least twice that of the actual radiation sensitive layer and possibly up to five times its thickness. Thus, the possibility exists that there will be under exposure of the radiation sensitive layer in the region of the sprayed particles.

In the case of positive plates this under exposure means that the radiation sensitive layer and the sprayed particles may not be sufficiently solubilised in the radiation struck areas to be completely removed by the developer liquid particularly if the developer liquid is partially exhausted. If so, the non-printing areas of the resultant printing plate can be stained and may accept ink and cause scumming during printing.

In the case of negative plates, the radiation sensitive layer and sprayed particles may not be sufficiently insolubilised and thus may be removed from the image by the developer liquid. If so, this would cause pin holes to be formed in the image. Also partially insoluble particles would contaminate the developer liquid.

According to one aspect of the present invention, there is provided a radiation sensitive device comprising a substrate carrying a radiation sensitive layer over coated with a discontinuous covering layer which is more radiation sensitive than the radiation sensitive layer, the ratio of the sensitivity of the radiation sensitive layer to the sensitivity of the covering layer being at least 1.5:1 when the sensitivities are expressed in milli joules per square cm.

According to another aspect of the present invention there is provided a method of producing a radiation sensitive device which comprises (i) providing a substrate carrying a radiation sensitive layer and (ii) forming a discontinuous covering layer on the radiation sensitive layer, the covering layer being more radiation sensitive than the radiation sensitive layer such that the ratio of the sensitivity of the radiation sensitive layer to the sensitivity the covering layer is at least 1.5:1 when the sensitivities are expressed in milli joules per square cm.

By providing the covering layer with a sensitivity which is greater than that of the radiation sensitive layer, the exposure requirements of the device are not deleteriously affected by the presence of the covering layer. It is preferred to form the covering layer by a simple spraying technique. However any other suitable method may be used including electrostatic spraying or the use of a profiled roller such as a gravure roller. The covering layer is such that it is in the form of discrete preferably non-overlapping, particles so that it is effectively of varying thickness and thus presents a rough, rather than a smooth, free surface. In this way vacuum drawdown is facilitated since air can escape from between the free surface of the device and the transparency via the spaces between adjacent particles. The characteristics of the covering layer may be varied by suitably controlling the spraying pressure, the distance between the spray nozzle and the device to be sprayed, the ambient temperature, and the temperature and the solids content of the material being sprayed.

It is found that generally the coating weight of the covering layer should be less than 0.5 g/m² (and preferably less than 0.10 g/m²) and the particle dimensions should be from about 10 to 20 microns in the direction parallel to the surface of the radiation sensitive layer and about 1 to 5 microns in the direction perpendicular to the surface of the radiation sensitive layer. By suitably controlling the characteristics of the covering layer, a vacuum drawdown time of from 10–20 seconds can be obtained without deleteriously affecting the exposure, development or reproduction.

The sensitivities referred to in this patent specification are those obtained in the following manner using an IL540 Photometer marketed by International Light, Inc. In the case of the sensitivity of the radiation sensitive layer, this was determined by using the photometer to measure the amount of radiation needed to expose, to a given degree, a layer having a coating weight of 1.0 g/m² i.e. a coating thickness of 1 micron. In the case of the sensitivity of the covering layer, a layer was formed having a composition identical to that of the covering layer and a coating weight of 1.0 g/m² i.e. a coating thickness of 1 micron. The photometer was then used to measure the amount of radiation needed to expose this layer to the same degree as before. The photometer expresses the amount of radiation used in milli Joules per square centimetre and the amount of radiation needed in each case provides a measure of the sensitivity. The more radiation needed the less is the sensitivity.

In a first embodiment of the present invention, the radiation sensitive layer is positive working and is in the form of a composition comprising a quinone diazide compound and an alkali soluble resin and the covering layer is formed of a composition comprising a quinone diazide compound and an alkali soluble resin which may be the same or different to those in the radiation sensitive layer, the ratio of resin to quinone diazide in the covering layer being at least twice the ratio of resin to quinone diazide in the radiation sensitive layer.

The covering layer is preferably formed on the radiation sensitive layer by spraying it with the quinone diazide and the resin dissolved in a solvent. Preferably the solvent is such that the surface of the radiation sensitive layer is slightly softened giving much improved adhesion. If the same resin as is present in the radiation sensitive layer is used, then incompatibility between the radiation sensitive layer and the covering layer, particularly in regard to their solubility in the developer liquid, is reduced.

In another embodiment of the present invention, the radiation sensitive layer is negative working and comprises a photo-crosslinkable material or a photo-insolubilisable material and the covering layer is formed of a composition comprising an ethylenically unsaturated prepolymer, a binder resin and a photoinitiator. The covering layer is preferably produced by spraying the surface of the radiation sensitive layer with said composition dissolved in a solvent.

Preferably the solvent is such that it slightly softens the surface of the radiation sensitive layer.

Examples of suitable photo-crosslinkable materials are polymeric azides as described in UK Patent Specifications No. 1377747 and cinnamate type compounds as, for example, described in U.S. Pat. No. 4,119,466. Examples of suitable photo-insolubilised materials are diazo diphenylamine formaldehyde condensation products (diazo resins) and poly functional diazo compounds as described in European Patent Specification No. 30862. Suitable ethylenically unsaturated prepolymers are simple compounds containing ethylenic unsaturation, as well as polymers containing end groups or pendent groups terminating with ethylenic unsaturation. Thus, the prepolymer may be a polymer having recurring units with the structure

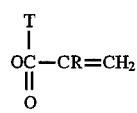

wherein T is any group capable of forming the backbone of a polymer and R is hydrogen or methyl. Alternatively the prepolymer may be a monomeric (meth)acrylate, (meth) acrylamide, allyl compound, vinyl ether, vinyl ester, N-vinyl compound, styrene, acrylonitrile or crotonate. Many examples of each of these classes are well known, such as those listed, for example, in UK Patent No. 1 534 137. A highly preferred class of prepolymer encompasses the (meth) acrylate compounds and particularly useful examples include alkyl (meth)acrylates containing from 1 to 30 and most preferably 1 to 5 carbon atoms in the alkyl portion, such as methyl and ethyl (meth) acrylates; pentaerythritol tri- and tetra (meth)acrylates; esters of polyols, including glycol di(meth)acrylates, such as tripropylene glycol diacrylate, tetraethylene glycol diacrylate and triethylene glycol dimethacrylate; alkanediol di(meth) acrylates; urethane (meth)acrylates such as the reaction products of hydroxyl group containing (meth)acrylates with di or poly isocyanates; epoxy (meth)acrylates; and mixtures of the above. Examples of suitable binders are acrylic polymers, vinyl acetate polymers, and novolak resins such as those listed in U.S. Pat. Nos. 3,652,275 and 4,268,667 and UK Patent Specification No. 2 006 775.

In a further embodiment of the present invention, the radiation sensitive layer is negative working and comprises a photo-crosslinkable material (e.g as described above) and the covering layer comprises an azide group-containing, di-acid chloride modified, epoxy resin. Again the covering layer is preferably produced by spraying the surface of the radiation sensitive layer with said azide group-containing epoxy resin material dissolved in a solvent. Preferably the solvent is such that it slightly softens the surface of the radiation sensitive layer. The azide group-containing resin may be prepared by reacting an epoxy resin (for example a resin derived from bisphenol A and epichlorhydrin) with an aliphatic di acid halide and then reacting the resultant compound with an azide group-containing acid halide.

The following Examples illustrate the invention:

EXAMPLE 1

Two radiation sensitive plates were produced by coating two sheets of electro grained and anodised aluminium with a radiation sensitive composition that had been prepared by dissolving 1 part by weight of a bis 1,2 naphthoquinone diazide-5 sulphonic acid ester of 2,4 dihydroxy benzophenone and 2 parts by weight of a cresol-novolak resin in 20 parts by weight of ethyl methyl ketone. The composition was dried to form radiation sensitive layers on the sheets. The composition of the radiation sensitive layer had a sensitivity of about 560 mJ/cm$^2$.

A first of the plates was then sprayed with a mixture, in 2 ethoxy ethanol acetate, of 10% by weight of the above quinone diazide and 90% by weight of the cresol novolak resin at 35% solids using a pressure fed spray gun. The sprayed material was at room temperature, the feed rate was 3–8 cc/min and the atomising air pressure was 40 psi. The temperature of the spraying environment was maintained at 37 degC and the plate was moved past the spray gun at 10 metre/min. In this way a discontinuous covering layer formed of particles of size 15 microns×3 microns was formed on the smooth surface of the radiation sensitive layer. The composition of the covering layer had a sensitivity of about 200 mJ/cm$^2$. The second plate was not treated.

The plates were placed in turn in a Berkey-Ascor printing down frame. A metal disc 10 mm in diameter and 1 mm thick was placed in the middle of each plate and covered with a fine half-tone screen having an area greater than the plate.

A piece of clear film of the same size as the plate and having drawn thereon two concentric rings of 80 and 10 mm diameter, was placed over the plate so that the inner ring coincided with the disc. The frame glass was lowered and the exposure lamps switched on.

Once the vacuum pump was switched on a pattern of concentric interference circles appeared centred on the disc. As the vacuum increased the circles contracted and the vacuum drawdown time was measured as the time taken from initiation of the vacuum until the interference circle crossed the 80 mm mark.

When tested in this way, the untreated second plate had a vacuum drawdown time of 1 1 minutes whereas the sprayed first plate had a vacuum drawdown time of only 8 seconds.

Two further plates were prepared in the same manner and exposed through a continuous tone step-wedge to a clear step 2 in the above mentioned frame. The plates were then developed using 5% aqueous sodium silicate solution, washed and inked-in in conventional manner to form lithographic printing plates. Both plates showed the same step-wedge reading and the sprayed plate showed no sign of scumming in the non-printing areas even when developed with partially exhausted developer.

EXAMPLE 2

Example 1 was repeated except that the covering layer of the first plate was produced by spraying a material comprising a 10 mole % 2, 1-naphthoquinone diazide-5-sulphonyl ester of cresol novolak dissolved in 2-ethoxy ethanol acetate at a ratio of 1 part solid to 2 parts solvent. The composition of the covering layer had a sensitivity of about 210 mJ/cm$^2$.

Similar results were obtained.

EXAMPLE 3

Example 1 was repeated except that the quinone diazide used in the covering layer of the first plate was the 2, 1-naphthoquinone diazide-5-sulphonyl ester of para-cumyl phenol. The composition of the covering layer had a sensitivity of about 190 mJ/cm$^2$.

Similar results were again obtained.

EXAMPLE 4

Example 1 was repeated except that the covering layer included the same ratio of quinone diazide to cresol-novolak as did the radiation sensitive layer. Thus both the composition of the covering layer and the composition of the radiation sensitive layer had the same sensitivity (about 560 mJ/cm$^2$)

Whilst the vacuum drawdown properties were similar, the radiation sensitive layer and the covering layer were not completely removed from the radiation struck areas on development even with fresh developer.

Further tests revealed that to produce fully developed non-printing areas, an increased exposure to give a clear step 4 was required and at this exposure the reproduction of the image was impaired.

EXAMPLE 5

Two electrograined and anodised sheets of aluminium were provided with a radiation sensitive layer in the manner disclosed in Example 1 of European Patent Specification No. 30862 to form radiation sensitive plates. Thus, the layer was formed from a diazo compound derived from the reaction product of p-(N-ethyl-N-2-hydroxy ethyl) amino acetanilide and diphenyl methane 4, 4' di isocyanate with lauryl sulphate at anion. The sensitivity was about 800 mJ/cm$_2$.

One plate was then sprayed with a 35% solids solution of methyl oxitol containing 45% dimethacrylate ester of diglycidyl ether of Bisphenol A;

45% cresol novolak support resin; and

10% 2-(4'-t-butyl peroxycarbonylbenzoyl) methylene-3-methyl benzo thiazoline under similar conditions to those of Example 1 to form a discontinuous covering layer on the diazo compound layer. The covering layer was composed of particles of size about 15 microns×3 microns and the sensitivity of the covering layer was about 200 mJ/cm$^2$. The vacuum drawdown test of Example 1 showed that whereas the unsprayed plate had a vacuum drawdown time of 1½ minutes, the sprayed plate only required 20 seconds.

Two further plates were prepared in the same way and exposed through a continuous tone step-wedge.

The plates were then developed using an aqueous solution containing 10% anionic surfactant and 10% benzyl alcohol. Both plates showed the same step-wedge reading and there was no evidence of pin-holing in the image.

EXAMPLE 6

Two radiation sensitive plates were prepared according to Example 15 of GB Patent Specification No. 1377747. Thus the radiation sensitive layers of the plates were formed from an epoxy resin ester of p-azidobenzal cyanoacetyl chloride. The sensitivity was about 600 mJ/cm$^2$.

One plate was then sprayed with a 35% solids solution of cyclohexanone containing 90% photo-crosslinkable compound; and 10% benzanthraquinone as sensitiser to form a discontinuous covering layer on the radiation sensitive layer. Similar spraying conditions of those of Example 1 were used and the size of the particles forming the covering layer was about 15 microns×3 microns.

The photo-crosslinkable compound was produced as follows:

To Epikote 1004 (23.4 g, 01 g mol) dissolved in dichloromethane (100 cm$^3$) was added succinyl chloride soln. (6.2 cm$^3$ of 10% w/v succinyl chloride in dichloromethane, 0.004 mol) followed by pyridine (0.66 cm³, 0.008 mol). (Epikote 1004 is a condensation product of bisphenol A and epichlorhydrin). This mixture was then refluxed for 16 hrs. before adding 4-azidobenzalcyanoacetyl chloride as a solution in dichloromethane (15 g dissolved in 60 cm³ dichloromethane, 0.064 mol) and pyridine (5.4 cm³, 0.07 mol). This mixture was further refluxed for 2 hrs. Thereafter a mixed ester was formed by adding octanoyl chloride (6.8 cm³, 0.04 mol) and pyridine (3.3 cm³, 0.04 mol). Refluxing was continued for 2 hrs. before filtration and precipitation of the desired photo-crosslinkable compound into isopropanol.

The covering layer had a sensitivity of 200 mJ/cm². The other plate was not sprayed.

Comparative drawdown tests showed an improvement in drawdown time from 1½ minutes to 10 seconds.

Comparative exposure tests showed the same step-wedge reading and there was no evidence of pin-holing of the images when the sprayed plate was developed using a mixture of a glycol ester and a wetting agent as described in UK Patent Specification No. 1 220 808.

EXAMPLE 7

Example 1 was repeated but in this case the covering layer comprised about 13% by weight of the quinone diazide and about 87% by weight of the cresol novolak resin. In this case the sensitivity of the covering layer was about 280 mJ/cm². Similar draw down times were obtained without deleteriously affecting the usefulness of the plate.

I claim:

1. A radiation sensitive device comprising a substrate carrying a radiation sensitive layer over coated with a discontinuous covering layer formed of a composition comprising the reaction product of an epoxy resin, a di-acid dihalide and an azide group-containing acid halide which is more radiation sensitive than the radiation sensitive layer, the ratio of the sensitivity of the radiation sensitive layer to the sensitivity of the covering layer being at least 1.5:1 when the sensitivities are expressed in milli joules per square cm.

2. A radiation sensitive device comprising a substrate carrying a radiation sensitive layer over coated with a discontinuous covering layer which is more radiation sensitive than the radiation sensitive layer, the ratio of the sensitivity of the radiation sensitive layer to the sensitivity of the covering layer being at least 1.5:1 when the sensitivities are expressed in milli joules per square cm, the radiation sensitive layer being formed of a composition comprising a quinone diazide and an alkali soluble resin.

3. A device as claimed in claim 2 wherein the covering layer is formed of a composition comprising a quinone diazide and an alkali soluble resin.

4. A device as claimed in claim 3 wherein the radiation sensitive layer is formed of a composition comprising a quinone diazide and or alkali soluble resin and wherein the ratio of resin to quinone diazide in the covering layer is at least twice the ratio of resin to quinone diazide in the radiation sensitive layer.

5. A radiation sensitive device comprising a substrate carrying a radiation sensitive layer formed of a photocross linkable material over coated with a discontinuous covering layer formed of a composition comprising an ethylenically unsaturated prepolymer, a binder resin and a photoinitiator, the ratio of the sensitivity of the radiation sensitive layer to the sensitivity of the covering layer being at least 1.5:1 when the sensitivities are expressed in milli joules per square cm.

6. A device as claimed in claim 1 wherein the substrate is in the form of a metallic sheet.

7. A device as claimed in claim 6 wherein the metallic sheet is a sheet of grained and anodised aluminium.

8. A method of producing a radiation sensitive device which comprising (i) providing a substrate carrying a radiation sensitive layer and (ii) forming a discontinuous covering layer on the radiation sensitive layer, the covering layer being formed of a composition comprising the reaction product of an epoxy resin, a di-acid dihalide and an azide group-containing acid halide and being more radiation sensitive than the radiation sensitive layer such that the ratio of the sensitivity of the radiation sensitive layer to the sensitivity of the covering layer is at least 1.5:1 when the sensitivities are expressed in milli joules per square cm.

9. A device as claimed in claim 2 wherein the substrate is in the form of a metallic sheet.

10. A device as claimed in claim 9 wherein the metallic sheet is a sheet of grained and anodized aluminum.

* * * * *